United States Patent [19]

Sato et al.

[11] Patent Number: 4,761,345

[45] Date of Patent: Aug. 2, 1988

[54] ALUMINUM NITRIDE SUBSTRATE

[75] Inventors: Hideki Sato; Nobuyuki Mizunoya; Mitsuhiro Nagata, all of Yokohama, Japan

[73] Assignee: Kabushiki kaisha Toshiba, Kawasaki, Japan

[21] Appl. No.: 16,906

[22] Filed: Feb. 20, 1987

[30] Foreign Application Priority Data

Feb. 20, 1986 [JP] Japan ................................. 61-33829

[51] Int. Cl.<sup>4</sup> .............................................. B22F 7/02
[52] U.S. Cl. .................................... 428/552; 428/555; 428/620; 428/627; 357/80; 148/DIG. 113
[58] Field of Search ............... 428/552, 555, 620, 627, 428/699; 148/DIG. 113; 357/80

[56] References Cited

U.S. PATENT DOCUMENTS

| | | | |
|---|---|---|---|
| 4,517,584 | 5/1985 | Matsushita et al. | 357/80 |
| 4,570,328 | 2/1986 | Price et al. | 148/DIG. 113 |
| 4,585,706 | 4/1986 | Takeda et al. | 428/620 |
| 4,610,933 | 9/1986 | Van de Leest | 428/627 |
| 4,656,101 | 4/1987 | Yamazaki | 428/627 |
| 4,659,611 | 4/1987 | Iwase et al. | 428/699 |

Primary Examiner—John F. Terapane
Assistant Examiner—Eric Jorgensen
Attorney, Agent, or Firm—Foley & Lardner, Schwartz, Jeffery, Schwaab, Mack, Blumenthal & Evans

[57] ABSTRACT

There is disclosed an aluminum nitride substrate which comprises a substrate composed of an aluminum nitride sintered product; an electroconductive metallized layer composed of titanium nitride and at least one selected from the group consisting of molybdenum, tungsten, tantalum, an element in group III of the periodic table, an element in group IVa of the same, a rare earth element, an actinide element and a compound containing these elements; and an electroconductive protective layer laminated in this order on the aluminum nitride sintered product.

14 Claims, No Drawings

ALUMINUM NITRIDE SUBSTRATE

BACKGROUND OF THE INVENTION

This invention relates to an aluminum nitride (AlN) substrate, more particularly to an AlN substrate, which is high in the bonding strength between the aluminum nitride (AlN) sintered product and the electroconductive metallized layer (hereinafter called "metallized layer") constituting the above substrate and also free from embrittlement through corrosion of titanium nitride (hereinafter called "TiN") constituting the metallized layer when bonding a metal member onto the metallized layer by soldering, etc.

In recent years, under the situation where high integration, high output and speed-up of electronic circuit are demanded, the substrate of semiconductor to be used therefor is required to have high thermal conductivity (heat dissipating characteristic) and electric insulating property, and further a coefficient of thermal expansion approximate to silicon chip. As the material satisfying such requirements, various ceramics have been widely used, and generally substrates of alumina ($Al_2O_3$) or berylia (BeO) have been known. However, the $Al_2O_3$ substrate has poor thermal conductivity, while the BeO substrate involves the problem of having toxicity. For these reasons, the substrate of AlN sintered product is recently attracting attention.

The AlN sintered product has a thermal conductivity which is as high as about 5-fold of that of $Al_2O_3$, and is also excellent in electrical insulation, and yet exhibits a thermal expansion ratio approximate to silicon chip.

When such a substrate of AlN sintered product is used as the semiconductor substrate, it is necessary to mount a silicon chip on this substrate and further bond and mount metal members such as bonding wire, etc., by brazing, soldering, etc., but the above members cannot be directly bonded onto the AlN sintered product. For this reason, it is generally practiced to form an electroconductive metallized layer on the AlN substrate and bond the above members successively on the metallized layer.

As the method for forming a metallized layer on the surface of an AlN sintered product, there have heretofore been employed the direct bond copper method (DBC method) or the thick film method by use of copper, gold, silver-palladium. However, the metallized layer formed by these methods involves the following problems.

That is, according to the DBC method and the thick film method, a metallized layer is formed at a low temperature of about 600° to 1100° C. For this reason, under a high temperature, the bonded strength between the AlN sintered product and the metallized layer may be sometimes lowered, whereby the metallized layer may be peeled off. That is, the bonded strengh of the metallized layer to the AlN sintered product under high temperature is small. Therefore, when bonding a metal member through the metallized layer onto the substrate, it is difficult to practice soldering under high temperature in which silver solder, etc., is generally employed. Also, in the case when assembled in a semiconductor device, there may ensue the problem that the metallized layer may be peeled off from the AlN sintered product by the heat or the heat cycle generated during use, whereby reliability during use is lowered.

For such reasons, a metallized layer having molybdenum and TiN co-present on the surface of the AlN sintered product is now developing. In fact, this metallized layer has greater bonded strength under high temperature as compared with the layer formed by the DBC method or the thick film method of the prior art, but the following problems ensue when various members are applied by brazing, high temperature soldering on the metallized layer. That is, when various metal members are bonded onto the metallized layer, soldering is generally practiced in a reducing atmosphere containing hydrogen gas. However, when TiN is contained as the constituent component in the metallized layer, this TiN is corroded by hydrogen gas to be embrittled, whereby the bonded strength with the AlN sintered product will be ultimately lowered. Accordingly, when TiN is contained in the metallized layer, the metal member can be bonded with difficulty by soldering in a reducing atmosphere, or, even if bonded, since the metallized layer is embrittled, peel-off phenomenon will frequently occur during practical application to lower its reliability remarkably.

SUMMARY OF THE INVENTION

An object of the present invention is to cancel the above problems in an AlN substrate provided with a metallized layer containing TiN and provide an AlN substrate which is high in bonding strength between the AlN sintered product and the metallized layer and also free from embrittlement of the metallized layer even in a reducing atmosphere containing hydrogen gas.

The AlN substrate of the present invention is characterized by having a substrate composed of an aluminum nitride sintered product; an electroconductive metallized layer composed of titanium nitride and at least one selected from the group consisting of molybdenum, tungsten, tantalum, an element in group IIIa or IIIb periodic table, an element in group IVb of the same, a rare earth element, an actinide element and a compound containing these elements; and an electroconductive protective layer laminated in this order on the aluminum nitride sintered product.

DESCRIPTION OF THE PREFERRED EMBODIMENTS

The AlN sintered product which is a constituent element of the substrate of the present invention may be anyone so long as it has a thermal conductivity of 50 w/m.k or higher. Such an AlN sintered product may include those composed of 90% by weight or more of AlN and 10% by weight or less of at least one selected from oxides of rare earth elements such as $Y_2O_3$, fluorides of rare earth elements such as YF, oxides of alkaline earth elements such as CaO, carbides of alkaline earth elements such as $CaC_2$ and fluorides of alkaline earth elements such as $CaF_2$, as additives. These sintered products may preferably be those containing, after sintering, YAG, YAL, AlON, etc. If the thermal conductivity is too low, the heat dissipating characteristic is undesirably inferior. The AlN sintered product can be obtained by molding AlN powder according to a known method and sintering the molded product.

On at least one surface of such a sintered product, a metallized layer as described below is formed.

The metallized layer contains titanium nitride (TiN); and at least one selected from the group consisting of molybdenum, tungsten, tantalum, an element in group III or IIIb of the periodic table, an element in group IVa of the same, a rare earth element, an actinide element and a compound containing these elements as the essential constituent element. That is, the metallized layer may be constituted by TiN and other constituent elements. It may finally exist as TiN in the metallized layer, for example, in the metallized layer obtained by coating a paste for the metallized layer on the AlN sintered product and then sintering the coated product in a reducing atmosphere.

Accordingly, titanium can be used as single substance, or a compound containing this or a mixture of these. Among them, examples of titanium compounds may include nitrate, nitrite, sulfate, sulfite, borate, carbonate, silicate, phosphate, phosphite, chloride, fluoride, chlorate, ammonium salt, oxalate, hydroxide, hydride, iodide, bromide, alkoxide, silicide, carbide, boride, nitride, oxide and sol-gel, etc., of the element, but nitride and oxide are particularly preferred.

Examples of other components constituting the metallized layer together with titanium nitride may include at least one selected from the group consisting of high melting metals such as molybdenum (Mo), tungsten (W), tantalum (Ta), etc., the group IIIa or IIIb elememts of the periodic table (B, Al, Sc, Ga, In, Ti), the group IVb elements (Ti, Zr, Hf), rare earth elements (Y, La, Ce, Pr, Nd, Pm, Sm, Eu, Gd, Tb, Dy, Ho, Er, Tm, Yb, Lu) and actinide elements (Ac, Th, Pa, U, Np, Pu, Am, Cm, Bk, Cf, Es, Fm, Md, No, Lr) and compounds of these. These are contained as a single kind or a combination of two or more kinds. In this case, these elements exist as a single substance or a compound or a solid solution containing the respective elements, or a mixture of two or more kinds selected from these single substances, compounds and solid solutions.

As a method for forming the metallized layer, it can be formed by dispersing the powder of the respective elements which are components constituting the above metallized layer or can become the constituent components or the compounds thereof as enumerated below in a binder to form a paste, then attaching the paste onto the surface of the AlN sintered product by the method such as coating or dipping, followed by calcination by heating. Examples of the compounds may include nitrates, nitrites, sulfates, sulfites, borates, carbonates, silicates, phosphates, phosphites, chlorides, fluorides, chlorates, ammonium salts, oxalates, hydroxides, hydrides, iodides, bromides, alkoxides, silicides, carbides, borides, nitrides, oxides and sol-gel, etc., containing the above metals. Of these, nitrides and oxides are particularly preferred. As the binder to be used in this case, for example, ethyl cellulose, nitrocellulose, etc., may be employed. The calcination conditions may differ depending on the metals constituting the metallized layer, but, for example, in the case of Mo-TiN, calcination is conducted at 1600° to 1800 ° C. for 0.5 to 2 hours. The heating atmosphere in this case may preferably be a non-oxidative atmosphere such as nitrogen gas atmosphere.

In the metallized layer thus formed, TiN should preferably be contained at a proportion of 5% by weight to 95% by weight, more preferably 15% by weight to 65% by weight. Also, the thickness of the metallized layer may preferably be 1 to 50 $\mu$m, more preferably 10 to 20 $\mu$m.

Subsequently, on the metallized layer is formed an electroconductive protective layer. This protective layer is provided for the purpose of protecting the metallized layer from hydrogen gas which is used during soldering, and therefore it is required to be dense. Also, since a metal member is bonded onto the protective layer, it is required to have electroconductivity. Examples of the constituent material of such electroconductive protective layer may include nickel, silver, gold, zinc, copper, chromium, tin, lead, etc., and these may be used either individually or as a suitable combination of two or more kinds. Of these, nickel, nickel-silver, nickel-gold, etc. are particularly preferred. As the method for forming the above electroconductive protective layer, the plating methods such as electroless plating, electrolytic plating, etc., the sputtering method, the vapor deposition method or other known methods may be applicable, which is not particularly limited so long as it is a method capable of forming a protective layer with a uniform thickness. Among these methods, the plating methods are particularly preferred. The electroconductive protective layer may be single or two or more layers. The thickness of the protective layer is 1 to 10 $\mu$m, preferably 3 to 6 $\mu$m. If this protective layer is too thin, the protective layer may be corroded by a soldering material to be peeled off. On the other hand, if it is too thick, blistering may occur to make soldering of the metal member difficult.

The aluminum nitride substrate of the present invention thus prepared may then be preferably carried out an annealing treatment at conditions of, for example, 600° to 1000° C. for 0.5 to 2 hours in order to heighten the denseness of the metallized layer and the electroconductive protective layer.

EXAMPLES

Examples 1 to 10

For the AlN sintered product, a flat plate of 50×50×0.635 mm containing 3% by weight of $Y_2O_3$ as the sintering aid was employed.

Powders of the respective metals or alloys shown in Table 1 were mixed at proportions indicated (% by weight), and 100 parts by weight of the mixture obtained were dispersed in 40 to 45 parts by weight of a binder (ethyl cellulose) to prepare a paste for metallized layer. Next, the paste was applied on the surface of the AlN sintered product to a thickness of 10 to 20 $\mu$m. After drying, this was calcined by heating under the condition shown in the Table. The constituent phase of the metallized layer obtained was observed by the X-ray diffraction method.

Then, an electroconductive protective layer with a thickness of 2 to 5 $\mu$m was formed on the metallized layer according to the method shown in the Table. Next, in forming gas, annealing was effected by heating at about 800° C. for 0.2 hours.

On the surface of the AlN substrate thus obtained, a pin made of Kovar (trade name, Ni-Co-Fe alloy) was soldered by use of silver solder in a gas mixture of hydrogen:nitrogen=1:1.

The bonded strength between the AlN sintered product and the metallized layer after annealing was measured by push-pull gauge. Also, the states of the structure of the metallized layer before and after soldering was observed by SEM. In the Table, the first group is titanium or its compound or a mixture of these, and the second group is a component which should become the constituent of the metallized layer other than TiN.

Comparative Examples 1–8

By use of the starting material paste with the composition shown in the Table, AlN substrates were obtained similarly as in Examples. However, no electroconductive protective layer was formed. For these AlN substrates, evaluation tests were conducted similarly as in Examples.

According to SEM observation, the metallized layers of the substrates of Examples having electroconductive protective layers formed were not found to be changed even after soldering, the metallized layers of the substrates of Comparative examples having no electroconductive protective layer formed were found to be clearly decolored, indicating remarkable state of embrittlement.

Also as is apparent from the Table, in the AlN substrate of the present invention, the AlN sintered product and the metallized layer exhibit high bonding strength, but in the substrate of Comparative example, the bonding strength was ⅓ or less as compared with the substrate of Example with the corresponding same starting material composition. Also, when tensile test was performed by a strength surpassing by far the above bonding strength, only the metallized layer was peeled off in the substrate of Comparative example. In contrast, in the substrate of the present invention, not only the electroconductive layer, but also a part of the sintered product was scraped out.

Next, the following tests shown below were carried out with respect to each substrate and the results are shown in Table 2 below.

(1) Electrical Resistance Test

Patterns having 0.1×15 mm and 0.5×15 mm were printed on the substrate and after metallized, resistivity of a conductor was measured according to the four terminal method.

(2) TCT (Thermal Cycle Test)

By setting −50° C.×0.5 hr. and 150° C.×0.5 hr. as one cycle, joint strength according to the tensile test and appearance after 1000 cycles were measured.

(3) High Temperature Resistance

The sample was allowed to stand at 150° C. for 1000 hours, joint strength according to the tensile test was measured.

(4) PCT (Pressure Cooker Test)

The sample was allowed to stand at 121° C. for 1000 hours under 2 atm., joint strength according to the tensile test and appearance were measured.

TABLE 1

| | Metallized layer starting material paste | | | Metallizing condition | | | Constituent phase of metallized layer | Constituent of electroconductive protective layer |
|---|---|---|---|---|---|---|---|---|
| | First group (part by weight) | Second group (part by weight) | Binder | Atmosphere | Temperature (°C.) | Time (hr) | | |
| Example 1 | TiN(35) | Mo(65) | Ethyl cellulose | Nitrogen gas | 1700 | 1 | Mo, TiN | Ni (2 to 3 μm) |
| Example 2 | TiN(35) | Mo(65) | Ethyl cellulose | Nitrogen gas | " | " | " | Ni + Au (2 to 3 μm) |
| Example 3 | TiN(65) | Mo(35) | Ethyl cellulose | Nitrogen gas | 1800 | " | " | Ni (2 to 3 μm) |
| Example 4 | " | " | Ethyl cellulose | Nitrogen gas | 1700 | " | " | Ni (2 to 3 μm) |
| Comparative example 1 | TiN(100) | — | Ethyl cellulose | Nitrogen gas | 1800 | " | TiN | — |
| Comparative example 2 | — | " | Ethyl cellulose | Nitrogen gas | 1700 | " | " | — |
| Comparative example 3 | TiN(50) | Mo(50) | Ethyl cellulose | Nitrogen gas | 1800 | " | Mo, TiN | — |
| Comparative example 4 | TiN(35) | Mo(65) | Ethyl cellulose | Nitrogen gas | " | " | " | — |
| Comparative example 5 | TiN(65) | Mo(35) | Ethyl cellulose | Nitrogen gas | " | " | " | — |
| Example 5 | TiN(35) | W(65) | Ethyl cellulose | Nitrogen gas | 1800 | 1 | W, TiN | Ni (2 to 3 μm) |
| Example 6 | " | " | Ethyl cellulose | Nitrogen gas | 1700 | " | " | Ni (2 to 3 μm) |
| Example 7 | TiN(20) | W(80) | Ethyl cellulose | Nitrogen gas | 1800 | " | " | Ni + Au (2 to 3 μm) |
| Example 8 | " | " | Ethyl cellulose | Nitrogen gas | 1700 | " | " | Ni + Au (2 to 3 μm) |
| Example 9 | TiN(50) | W(50) | Ethyl cellulose | Nitrogen gas | 1800 | " | " | Ni (2 to 3 μm) |
| Example 10 | " | " | Ethyl cellulose | Nitrogen | 1700 | " | " | Ni (2 to 3 μm) |

TABLE 1-continued

| | Metallized layer starting material paste | | | Metallizing condition | | | Constituent phase of metallized layer | Constituent of electro-conductive protective layer |
|---|---|---|---|---|---|---|---|---|
| | First group (part by weight) | Second group (part by weight) | Binder | Atmos-phere | Tempera-ture (°C.) | Time (hr) | | |
| Compara-tive example 6 | TiN(35) | W(65) | Ethyl cellu-lose | Nitro-gen gas | 1800 | " | " | — |
| Compara-tive example 7 | TiN(20) | W(80) | Ethyl cellu-lose | Nitro-gen gas | " | " | " | — |
| Compara-tive example 8 | TiN(50) | W(50) | Ethyl cellu-lose | Nitro-gen gas | " | " | " | — |

TABLE 2

| | Joint strength (kg/mm²) | Electric resistivity (μΩ · cm) | TCT (1000 cycles) (kg/mm²) | High temperature resistance (kg/mm²) | PCT 120° C., 2 atm × 1000 hr. (kg/mm²) |
|---|---|---|---|---|---|
| Example 1 | 4 | 15 | 4 | 4 | 4 |
| Example 2 | 5 | 12 | 5 | 5 | 5 |
| Example 3 | 5 | 18 | 5 | 5 | 5 |
| Example 4 | 5 | 18 | 5 | 5 | 5 |
| Comparative Example 1 | 4 | 23 | 3 | 3 | 3 |
| Comparative Example 2 | 3 | 23 | 2 | 2 | 2 |
| Comparative Example 3 | 2 | 14 | less than 1 | less than 1 | less than 1 |
| Comparative Example 4 | 4 | 11 | less than 1 | less than 1 | less than 1 |
| Comparative Example 5 | 5 | 18 | less than 2 | less than 2 | less than 2 |
| Example 5 | 4 | 13 | 4 | 4 | 4 |
| Example 6 | 3 | 13 | 3 | 3 | 3 |
| Example 7 | 5 | 10 | 5 | 5 | 5 |
| Example 8 | 4 | 10 | 4 | 4 | 4 |
| Example 9 | 4 | 19 | 4 | 4 | 4 |
| Example 10 | 4 | 18 | 4 | 4 | 4 |
| Comparative Example 6 | 4 | 13 | less than 2 | less than 2 | less than 2 |
| Comparative Example 7 | 5 | 10 | less than 2 | less than 2 | less than 2 |
| Comparative Example 8 | 4 | 19 | less than 2 | less than 2 | less than 2 |

As seen from Table 2, Comparative examples 1 and 2 which use TiN only are inferior to those of the present invention in the joint strength after each tests and are insufficient in reliability.

As described above, in the AlN substrate of the present invention, the bonding strength between the AlN sintered product and the metallized layer constituting this substrate is extremely high. Also, since this substrate has further an electroconductive protective layer as the protective layer on the metallized layer, the metallized layer will not be embrittled even when the metal members may be soldered in an atmosphere containing hydrogen gas. Therefore, no peel-off phenomenon will occur during practical application. Further, this substrate is also excellent in heat-resistant cycle characteristic, and can be used for contemporary substrates for highly integrated high output electronic circuits, ignitor, high frequency transistors, laser tubes, magnetron or various heaters.

We claim:

1. An aluminum nitride substrate comprising: a substrate composed of an aluminum nitride sintered product; an electroconductive metallized layer laminated on said substrate composed of titanium nitride and at least one member selected from the group consisting of molybdenum, tungsten, tantalum, scandium, yttrium, boron, aluminum, gallium, indium, thallium, titanium, zirconium, and hafnium, the rare earth elements, the actinide elements and compounds containing any of these elements; and an electroconductive protective layer laminated on said metallized layer.

2. A semiconductor substrate comprising the aluminum nitride substrate according to claim 1.

3. A semiconductor substrate according to claim 2, additionally comprising a metal member bonded to said substrate.

4. A semiconductor substrate according to claim 3, wherein said metal member is bonded to said substrate by soldering or brazing.

5. An aluminum nitride substrate according to claim 1, wherein the electroconductive metallized layer is a layer containing titanium nitride; and at least one member selected from the group consisting of molybdenum, tungsten, tantalum, zirconium, hafnium and yttrium, and compounds composed of these elements.

6. An aluminum nitride substrate according to claim 1, wherein the electroconductive metallized layer is a layer containing 5 to 95% by weight of titanium nitride.

7. An aluminum nitride substrate according to claim 1, wherein the electroconductive metallized layer has a layer thickness of 1 to 50 μm.

8. An aluminum nitride substrate according to claim 1, wherein the electroconductive protective layer is prepared by the electroless plating method or the electrolytic plating method.

9. An aluminum nitride substrate according to claim 1, wherein the electroconductive protective layer is a nickel plated layer.

10. An aluminum nitride substrate according to claim 1, wherein the electroconductive protective layer has a layer thickness of 1 to 10 μm.

11. An aluminum nitride substrate according to claim 1, wherein the compounds containing the elements are selected from the group consisting of nitrates, nitrites, sulfates, sulfites, borates, carbonates, silicates, phosphates, phosphites, chlorides, fluorides, chlorates, ammonium salts, oxalates, hydroxides, hydrides, iodides, bromides, alkoxides, silicides, carbides, borides, nitrides, oxides and sol-gel.

12. An aluminum nitride substrate according to claim 1, wherein the compounds containing the elements are selected from the group consisting of nitrides and oxides.

13. An aluminum nitride substrate according to claim 1, wherein the electroconductive metallized layer is a layer containing 15 to 65% by weight of titanium nitride.

14. An aluminum nitride substrate according to claim 1, consisting essentially of the substrate, the metallized layer and the protective layer.

* * * * *